(12) United States Patent
Danciu et al.

(10) Patent No.: US 7,378,670 B2
(45) Date of Patent: May 27, 2008

(54) SHIELDING ASSEMBLY FOR A SEMICONDUCTOR MANUFACTURING APPARATUS AND METHOD OF USING THE SAME

(75) Inventors: Cornel Danciu, Portland, OR (US); Thomas Abels, Fairview, OR (US); Brian Good, Eugene, OR (US)

(73) Assignee: Toyo Tanso Co., Ltd., Osaka (JP)

( * ) Notice: Subject to any disclaimer, the term of this patent is extended or adjusted under 35 U.S.C. 154(b) by 1000 days.

(21) Appl. No.: 10/177,970

(22) Filed: Jun. 21, 2002
(Under 37 CFR 1.47)

(65) Prior Publication Data
US 2003/0038252 A1    Feb. 27, 2003

Related U.S. Application Data

(60) Provisional application No. 60/300,313, filed on Jun. 22, 2001.

(51) Int. Cl.
*G21K 5/10* (2006.01)

(52) U.S. Cl. ............... 250/492.21; 250/515.1; 438/514

(58) Field of Classification Search ........... 250/492.21, 250/515.1
See application file for complete search history.

(56) References Cited

U.S. PATENT DOCUMENTS

| 4,914,292 | A | | 4/1990 | Tamai et al. |
| 5,396,076 | A | | 3/1995 | Kimura |
| 5,554,854 | A | * | 9/1996 | Blake ............... 250/492.21 |
| 5,883,393 | A | * | 3/1999 | Tien et al. ......... 250/492.21 |
| 5,947,053 | A | * | 9/1999 | Burnham et al. ...... 116/208 |
| 6,239,440 | B1 | | 5/2001 | Abbott |
| 2003/0079834 | A1 | * | 5/2003 | Good ................. 156/345.1 |

* cited by examiner

*Primary Examiner*—Robert Kim
*Assistant Examiner*—Phillip A. Johnston
(74) *Attorney, Agent, or Firm*—Klarquist Sparkman, LLP

(57) ABSTRACT

A shielding assembly for use in a semiconductor manufacturing apparatus, such as an ion implantation apparatus, includes one or more removable shielding members configured to cover inner surfaces of a mass analyzing chamber. The shielding assembly reduces process by-products from accumulating on the inner surfaces. In one embodiment, a shielding assembly includes first and second shielding members, each having a unitary construction and configured to cover a magnetic area in the mass analyzing chamber. The shielding members desirably are made entirely of graphite or impregnated graphite to minimize contamination of the semiconductor device being processed caused by metal particles eroded from the inner surfaces of the mass analyzing chamber.

29 Claims, 2 Drawing Sheets

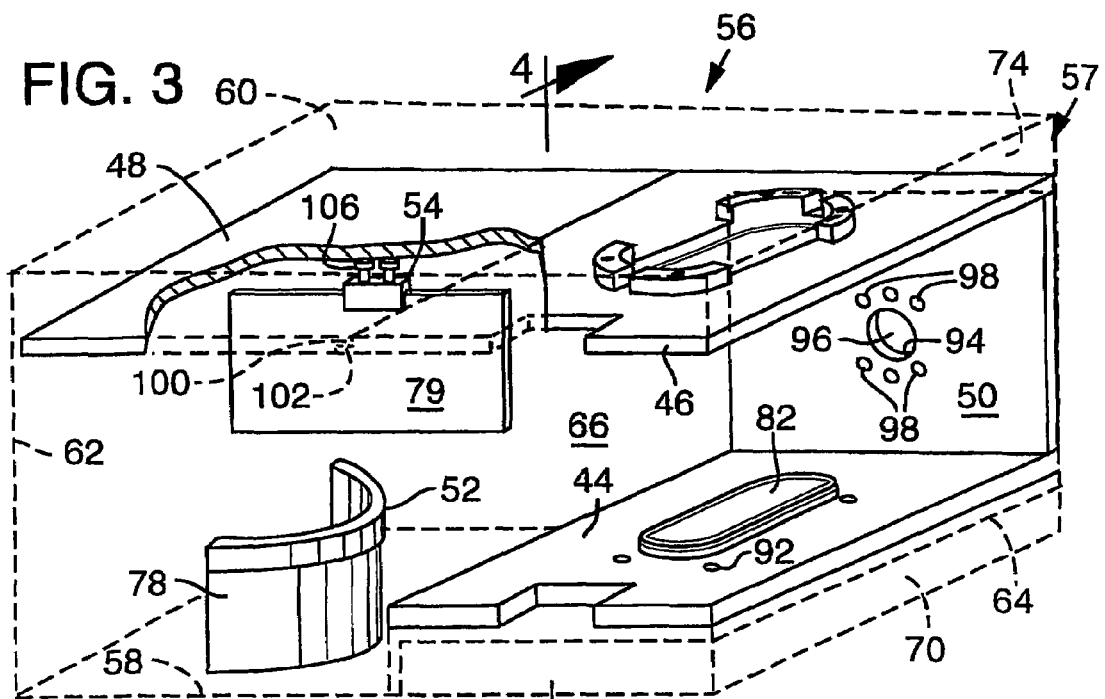
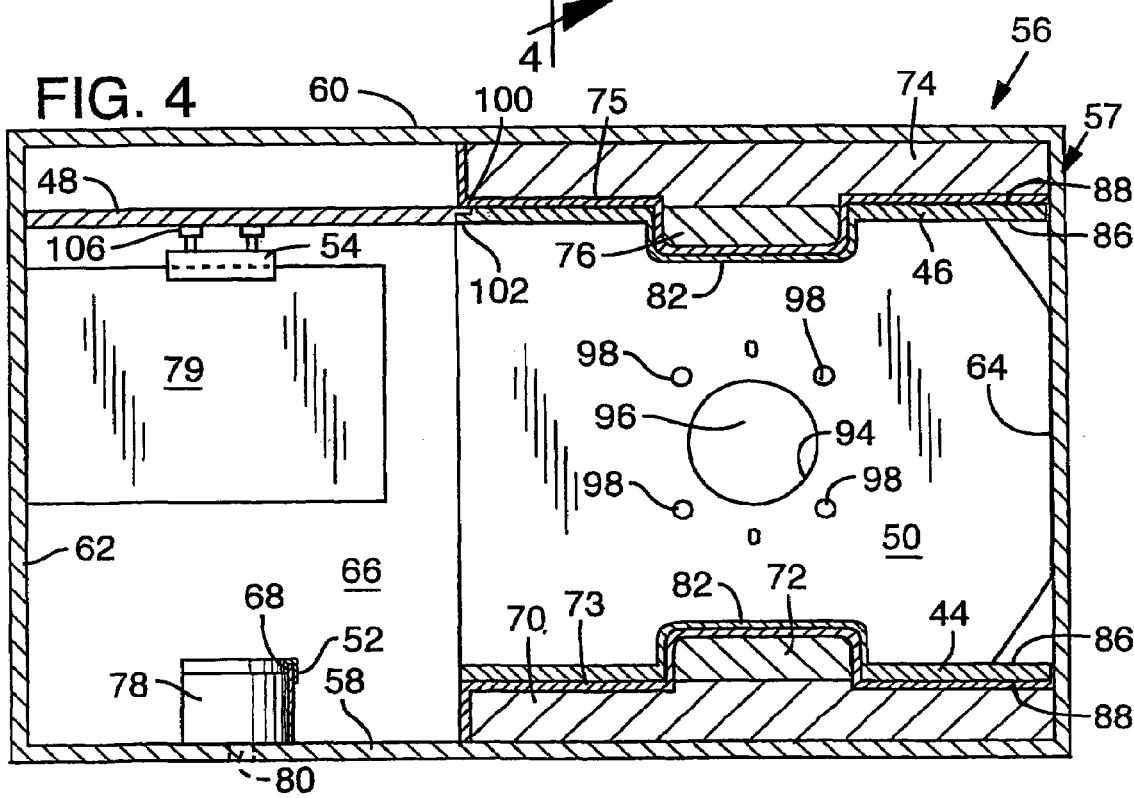

SHIELDING ASSEMBLY FOR A SEMICONDUCTOR MANUFACTURING APPARATUS AND METHOD OF USING THE SAME

CROSS-REFERENCE TO RELATED APPLICATION

This application claims priority to U.S. Provisional Application No. 60/300,313, filed Jun. 22, 2001, which is incorporated herein by reference.

FIELD

The present invention generally concerns a shielding assembly for use in a semiconductor manufacturing apparatus, such as an ion implantation apparatus.

BACKGROUND

Ion implantation devices are used in semiconductor manufacturing to introduce dopants into semiconductor wafers. Generally, an ion implantation device includes an ion source that generates charged dopant particles and an extraction electrode that extracts the particles from the ion source and initiates an ion beam along a beam path toward a target (e.g., a semiconductor wafer). Downstream of the extraction electrode, the ion beam passes through a mass analyzing chamber, which selectively separates components from the ion beam so that only ions of the desired mass are directed toward the target. The mass analyzing chamber typically is fluidly connected to a vacuum pump for establishing a sub-atmospheric pressure inside the chamber. From the mass analyzing chamber, the ion beam passes through an accelerator for accelerating the ions into a target chamber, wherein the ions are implanted into the target.

Ion implantation devices are complex and expensive to operate and maintain. A particular problem in the use of ion implantation devices is that impurities generated during the doping process accumulate on the internal surfaces of the device, and especially the internal surfaces of the mass analyzing chamber. Consequently, the internal surfaces of the ion implantation device, typically made of metallic materials, such as stainless steel or aluminum, must be cleaned on a regular basis to ensure that the device operates within specified parameters. Typically, the internal surfaces are manually cleaned with hydrogen peroxide or other suitable solvents. However, the process of manually cleaning the internal surfaces of the device is time consuming and difficult due to the small spaces within the device and lack of access to the surfaces requiring such cleaning.

When re-starting the ion implantation device following the cleaning process, the vacuum pump is activated to re-establish a sub-atmospheric pressure in the mass analyzing chamber, which in turn can cause excessive outgassing of residual solvent in the chamber. Removal of the gaseous solvent from the chamber requires additional pump-down time before the device can be put back on line. Thus, it would be desirable to minimize or eliminate the use of solvents, such as hydrogen peroxide, in ion implantation devices to reduce downtime and increase the production yield in the manufacture of semiconductor devices.

Another problem area with conventional mass analyzing chambers is that the metallic inner surfaces of the chamber are subject to wear by the high-energy ion beam that passes through the chamber. Metallic material eroded or sputtered from the inner surfaces of the chamber is transported to and implanted into the semiconductor wafer. As a result of this contamination, the semiconductor wafer will have degraded performance, reliability and functionality.

Accordingly, a continuing need exists for improvements in ion implantation systems used for the fabrication of semiconductor devices.

SUMMARY

The present disclosure generally pertains to removable shielding devices that can be used to cover, or shield, the inner surfaces of a semiconductor manufacturing apparatus, such as an ion implantation apparatus, for the purpose preventing impurities produced during operation of the apparatus from accumulating on the inner surfaces of the apparatus.

In one representative embodiment, a method for using of an ion implantation apparatus having a mass analyzing chamber includes providing a removable shielding assembly for the mass analyzing chamber, the shielding assembly comprising at least first and second removable shielding members. The shielding assembly is installed in the mass analyzing chamber such that the first shielding member covers a first magnetic area inside the mass analyzing chamber and the second shielding member covers a second magnetic area inside the mass analyzing chamber. With the shielding assembly installed in the mass analyzing chamber, the ion implantation apparatus can be operated in a conventional manner for implanting ions into a semiconductor wafer.

To ensure that the ion implantation apparatus operates within process parameters, the ion implantation apparatus is shut down after a period of use and the shielding assembly is removed from the mass analyzing chamber and cleaned to remove any contamination. The shielding assembly may be cleaned with a suitable cleaning agent, such as hydrogen peroxide, alcohol, acetone or other suitable solvents. Thereafter, the shielding assembly may be treated using conventional techniques (e.g., heating the shielding assembly) to remove residual cleaning agent on the shielding assembly to minimize outgassing when the shielding assembly is re-installed and the apparatus is re-started. Once the shielding assembly is cleaned and treated as described, it can be re-installed in the mass analyzing chamber for further processing of semiconductor wafers.

In another representative embodiment, a shielding member for use inside a mass analyzing chamber of an ion implantation apparatus comprises a unitary body configured to cover a magnetic area in the mass analyzing chamber. The shielding member desirably is made of graphite or impregnated graphite and configured to be easily removable from the mass analyzing chamber to permit cleaning of the shielding member outside of the mass analyzing chamber.

In particular embodiments, the body has a raised central portion for covering a magnet core and a substantially flat outer portion surrounding the central portion, with the central portion being generally oblong with parallel, opposing sides and arcuate, opposing ends extending between the respective sides.

According to yet another representative embodiment, an ion implanting apparatus includes a mass analyzing chamber having a bottom surface and a top surface, with the bottom surface having a bottom magnetic area and a top surface having a top magnetic area. A first shielding member includes a unitary body having a raised central portion for completely covering the bottom magnetic area and an outer portion substantially surrounding the central portion. A second shielding member includes a unitary body having a raised central portion for completely covering the top magnetic area and an outer portion substantially surrounding the central portion. Desirably, the first and second shielding members are configured to be easily removable from the mass analyzing chamber to facilitate cleaning of the shielding members.

The apparatus also can include third and fourth shielding members, with the third shielding member configured to cover a side surface inside the mass analyzing chamber extending between the top and bottom surfaces, and the fourth shielding member configured to cover a portion of the top surface of the chamber in a side-by-side relationship with the second shielding member.

A support mechanism, adapted for mounting in the mass analyzing chamber, may be used to assist in supporting the fourth shielding member in the chamber. The support mechanism desirably is configured to vary the tilt of the fourth shielding member relative to the top surface. In one embodiment, the support mechanism comprises a body and at least one adjusting bolt threadably received in the body. When mounted in the chamber, the fourth shielding member is supported on the adjusting bolt of the support mechanism such that adjusting the bolt is effective to vary the tilt of the fourth shielding member relative to the top surface.

These and other features will be more fully appreciated when the following detailed description is read in conjunction with the accompanying drawings.

BRIEF DESCRIPTION OF DRAWINGS

FIG. 3 is a schematic, perspective view of a mass analyzing chamber of an ion implantation device, showing the shielding assembly of FIG. 2 installed inside the chamber.

FIG. 4 is a cross-sectional view of the mass analyzing chamber taken along line 4-4 of FIG. 3

DETAILED DESCRIPTION

Figure 1:
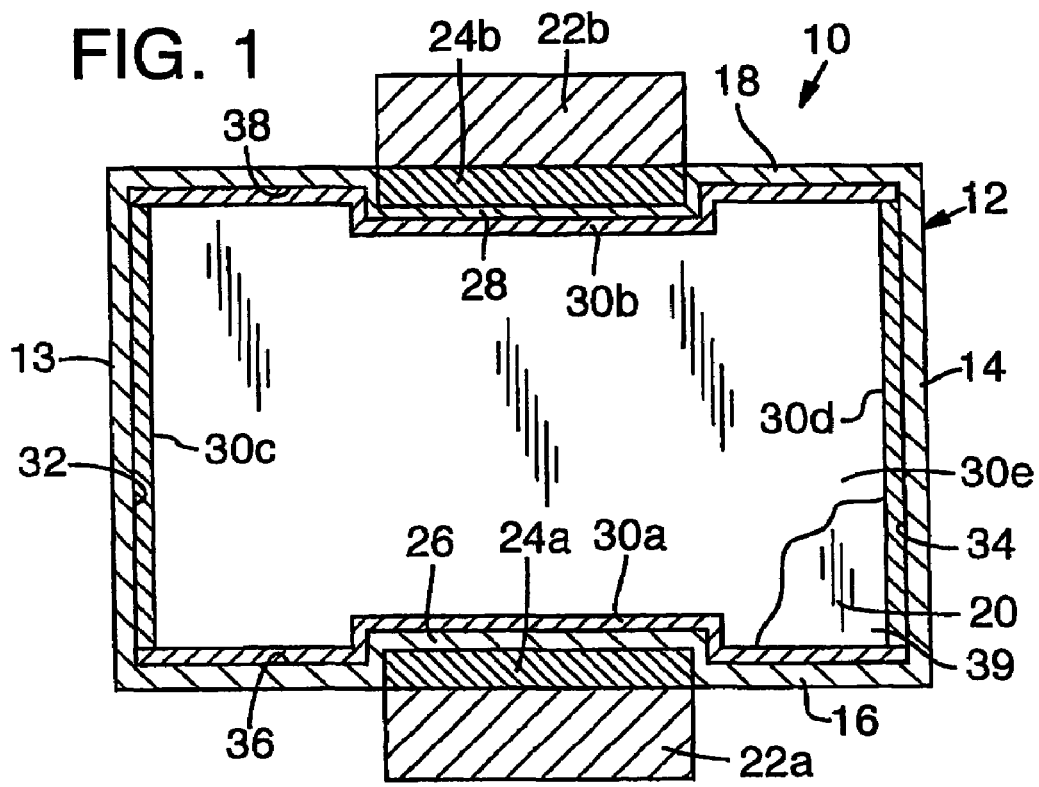
FIG. 1 is a schematic, cross-sectional view of a mass analyzing chamber of an ion implantation device, in which there is installed a shielding assembly, according to one embodiment, comprising a plurality of shielding members for shielding the inner surfaces of the chamber from impurities produced during operation of the device.

Referring first to FIG. 1, there is shown a mass analyzing chamber of an ion implantation device, indicated generally at 10, according to one embodiment. The chamber 10 comprises a shell 12, which includes side walls 13 and 14, a bottom wall 16, a top wall 18, a rear wall 20, and a front wall (not shown) in opposing relationship with the rear wall 20. The shell 12 typically is made of metallic materials, such as stainless steel or aluminum. Side walls 13 and 14, bottom wall 16, top wall 18, and rear wall 20 have respective inner surfaces 32, 34, 36, 38, and 39, respectively, as shown.

The chamber 10 also has first and second analyzing magnets 22a and 22b, having magnet cores 24a and 24b, respectively, in a spaced apart and opposing configuration. Magnet cores 24a, 24b are positioned in respective raised portions 26 and 28 of the bottom wall 16 and top wall 18, respectively.

The portions of the bottom wall 16 and top wall 18 covering magnet cores 24a, 24b form respective "magnetic areas" of the bottom wall and top wall. Thus, in the illustrated embodiment, for example, raised portions 26 and 28 form such "magnetic areas" in the bottom and top wall, respectively.

One or more removable shielding members may be installed inside the chamber 10 for covering, or shielding, portions of the inner surfaces of the shell 12 to assist in preventing process by-products from accumulating on those surfaces during use of the ion implantation device. As used herein, to "cover" a surface with a shielding member means to place a surface of the shielding member in a juxtaposed relationship with the surface to be covered. Accordingly, a shielding member may be in direct contact with or spaced from the surface to be covered.

In the embodiment of FIG. 1, for example, a shielding assembly includes a plurality of shielding members 30a, 30b, 30c, 30d, and 30e, with shielding member 30a covering the inner surface 36 of the bottom wall 16, shielding member 30b covering the inner surface 38 of top wall 18, shielding member 30c covering the inner surface 32 of side wall 13, shielding member 30d covering the inner surface 34 of side wall 14, and shielding member 30e covering the inner surface 39 of rear wall 20. An additional shielding member (not shown) may be used to cover the inner surface of the front wall (not shown).

In the illustrated mass analyzing chamber 10, all of the inner surfaces of the shell 12 are covered by shielding members to prevent any process by-products from accumulating on the inner surfaces of the shell 12. However, this is not a requirement. In alternative embodiments, for example, shielding members may be used to cover only the inner surfaces of the shell 12 on which the accumulation of process by-products mostly occurs. In some mass analyzing chambers, for example, the accumulation of process by-products mostly occurs on the magnetic areas inside the chamber. In such cases, covering only the magnetic areas may be effective to limit the accumulation of process by-products on the inner surfaces of the shell to an acceptable level.

The shielding members 30a, 30b, 30c, 30d, and 30e in the illustrated configuration are shaped generally to correspond to the shape of the surfaces they cover. Accordingly, shielding members 30c, 30d, and 30e are substantially planar to correspond to side walls 13 and 14 and rear wall 20, and shielding members 30a and 30b have raised central portions corresponding to raised portions 26 and 28 of the bottom wall 16 and top wall 18, respectively. It should be understood, however, that the shape of the shielding members may be varied as needed to accommodate the shapes of different chambers or as otherwise desired.

The shielding members 30a, 30b, 30c, 30d, and 30e may be secured to the inner surfaces of the shell 12 in any suitable manner, such as with bolts or other types of fasteners, or indirectly by engagement with one or more other shielding members (by, e.g., abutment or a dove-tail joint). Desirably, the shielding members 30a, 30b, 30c, 30d, and 30e are configured to be easily removable from the chamber 10 to facilitate cleaning of the shielding members, as further described below. In addition, the shielding members 30a, 30b, 30c, 30d, and 30e desirably are made of graphite, or alternatively, graphite impregnated with resin or other suitable materials (commonly known as "impregnated graphite"). Preferably, isotropic graphite may be used, although this is not required. Other composite or carbon-based materials, such as glassy carbon or carbon fiber reinforced composites, also may be used.

In alternative embodiments, the shielding members 30a, 30b, 30c, 30d, and 30e may be made of a metallic material coated with an overlying layer of graphite or impregnated graphite. However, this construction is less desirable than shielding members made entirely of graphite or impregnated graphite because the ion beam may cause the overlying graphite layer to erode away, thereby exposing the metallic material and subjecting the semiconductor wafer to contamination from sputtered metal particles.

The ion implantation device may be used to implant dopants into semiconductor wafers, as generally known in the art. In operation, process by-products accumulate on the shielding members 30a, 30b, 30c, 30d, and 30e inside the chamber 10. To ensure that the device operates within accepted process parameters, the shielding members 30a, 30b, 30c, 30d, and 30e are removed from the chamber 10 after a period of use and cleaned with a suitable solvent (e.g., hydrogen peroxide, alcohol, or acetone) to remove any by-products that may have accumulated on their surfaces. The shielding members can then be treated using known techniques to remove any residual solvent, such as by heating the shielding members. In this manner, outgassing resulting from residual solvent in the chamber can be avoided. Thereafter, the shielding members are re-installed inside the chamber 10 and the device can be re-started for further processing of semiconductor wafers.

The use of the shielding members provides several advantages. For example, the cleaning process described above is easier and can be accomplished much faster than the traditional method of cleaning the inner surfaces of the chamber. In an alternative approach to the foregoing method, two sets of shielding members can be provided for a single ion implantation apparatus. Thus, while one set is being cleaned, the other set can be used in the chamber, thereby further decreasing the down time of the apparatus.

Moreover, by minimizing or totally eliminating the use of a solvent (e.g., hydrogen peroxide) to clean the inside of the chamber 10, little, if any, outgassing of the solvent occurs when the device is re-started. As a result, less time is required to pump down the chamber before the device is put back on line for further processing of semiconductor wafers. Thus, by using the shielding members, the number of worker-hours required for maintaining the device, as well as the amount of time the device is kept off-line, is significantly reduced and the production yield of semiconductor devices is increased.

In addition, as noted above, a problem associated with some conventional mass analyzing chambers is that metallic material eroded or sputtered from the inner surfaces of the chamber contaminates the semiconductor wafer being processed. However, contamination caused by graphite or impregnated graphite does not affect semiconductor performance to the extent of contamination caused by metallic materials like stainless steel or aluminum. Thus, the use of graphite or impregnated graphite shielding members provides the additional advantage of minimizing wafer contamination caused by metal sputtering. In addition, as mentioned above, the shielding members are configured to be easily removable from the chamber. This allows periodic replacement of the shielding members before the shielding members are worn away and the underlying metal surfaces of the chamber are exposed.

Figure 2:
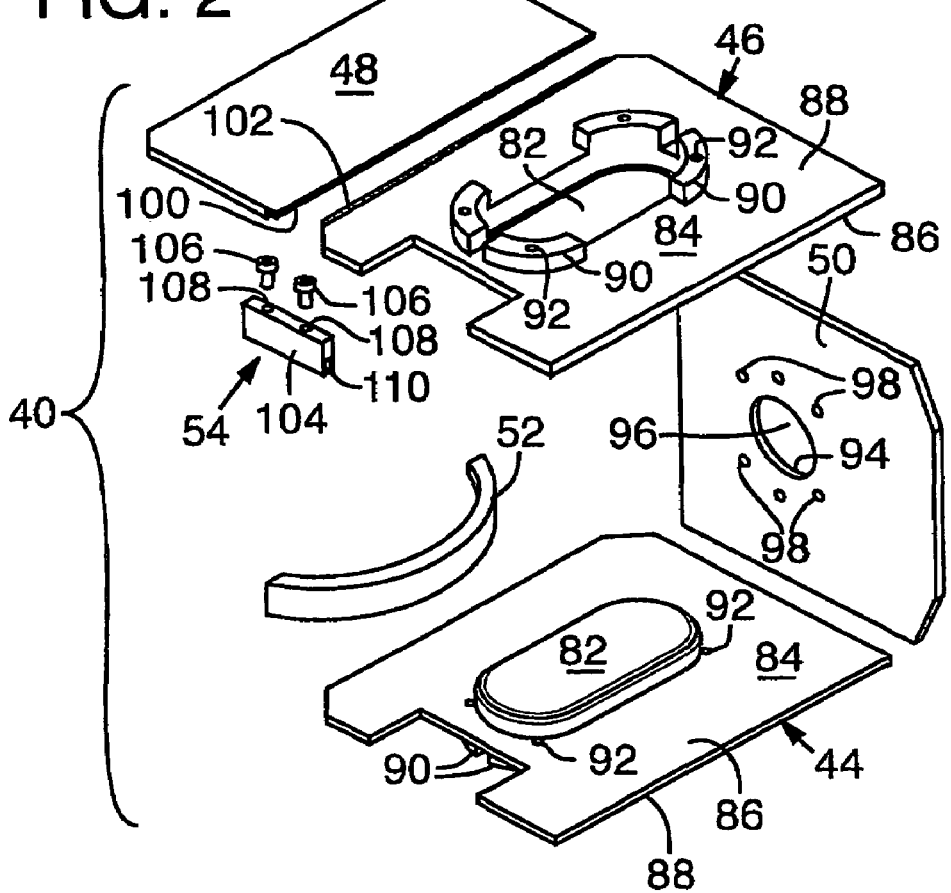
FIG. 2 is a perspective view of a shielding assembly, according to another embodiment, comprising a plurality of shielding members.

Referring to FIG. 2, there is shown a shielding assembly, indicated generally at 40, according to another embodiment. The shielding assembly 40 includes a first shielding member 44, a second shielding member 46, a third shielding member 48, a fourth shielding member 50, and a fifth shielding member 52 for covering respective surface portions inside a mass analyzing chamber of an ion implantation device. The shielding assembly 40 also includes a support mechanism 54 to assist in supporting the third shielding member 48 inside a chamber, as further described below.

In a working embodiment, the shielding assembly 40 is configured for use in the mass analyzing chamber of a model Vision 80 ion implanter, manufactured by Varian Semiconductor Equipment Associates, Inc. of Gloucester, Mass. FIGS. 3 and 4 are schematic illustrations of such a mass analyzing chamber, indicated generally at 56, shown with the shielding assembly 40 installed inside the chamber.

As shown, the illustrated mass analyzing chamber 56 comprises a shell 57, which can be made of metal (e.g., stainless steel or aluminum). The shell 57 includes a bottom wall 58, a top wall 60, side walls 62 and 64, a rear wall 66, and a front wall (not shown) in opposing relationship with the rear wall 66. A first magnet 70 having a magnet core 72 and an outer metal layer 73 is disposed on the bottom wall 58. A second magnet 74 having a magnet core 76 and outer metal layer 75 is positioned on the top wall 60, opposite the first magnet 70 (as best shown in FIG. 4). The portion of metal layers 73 and 75 covering magnet cores 72 and 76 define respective "magnetic areas" in the chamber.

An arcuate shaped barrier, or wall, 78 extends upwardly from the bottom wall 58 between the side wall 62 and the first magnet 70. A vacuum port 80 is located adjacent the concave surface of the barrier 78 (FIG. 4). The rear wall 66 is formed with an outlet opening 96, through which an ion beam extends during operation of the chamber 56. An extension piece 79 is connected to and extends from the side wall 62. As shown in FIG. 3, the extension piece 79 is spaced from the rear wall 66.

The first shielding member 44 is configured to cover the outer metal layer 73 of the first magnet 70 and the second shielding member 46 is configured to cover the outer metal layer 75 of the second magnet 74. In the illustrated embodiment, the first and second shielding members 44, 46, respectively, are identical in construction, and therefore are interchangeable. As best shown in FIG. 2, each of the first and second shielding members 44, 46, has a raised central portion 82 for covering a respective magnet core 72, 76 and a substantially flat outer portion 84 surrounding the central portion 82. The central portion 82 is generally oblong with parallel, opposing sides and arcuate, opposing ends extending between the respective sides so as to correspond to the shape of the magnet cores 72, 76. The outer portion 84 has first and second opposed major surfaces 86 and 88, respectively, with extension pieces 90 extending from the second major surface 88. When shielding members 44 and 46 are installed in the chamber 56, the extension pieces 90 are received in slots (not shown) surrounding magnet cores 72 and 76 so that the respective second surfaces 88 of shielding members 44, 46 lie flat on metal layers 73, 75 (FIG. 4).

The first and second shielding members 44, 46 desirably are configured to be easily removable from the chamber 56 to facilitate cleaning. As shown in FIGS. 2 and 3, for example, the first and second shielding members 44, 46 are formed with holes 92 for receiving bolts or screws (not shown) for securing the shielding members to the first and second magnets 70, 74, respectively. In some configurations, the close fit of the shielding members at adjacent edges may also assist in securing the shielding members within the chamber.

Referring again to FIGS. 3 and 4, the third shielding member 48 is configured to cover a portion of the top wall 60, in a side-by-side relationship with the second shielding member 46. In this manner, the third shielding member 48 serves as an "extension" of the second shielding member 46.

Shielding member 48 can be formed with a lip portion 100 extending along one side thereof, which overlaps an adjacent lip portion 102 of the second shielding member 46 when the second and third shielding members are installed in the chamber 56.

The support mechanism 54 is used to assist in supporting the third shielding member 48 in the chamber 56. As best shown in FIG. 2, the support mechanism 54 in the illustrated configuration comprises a body 104, with one or more adjusting screws 106 threadably received in corresponding holes 108 formed in the top surface of the body 104. The support mechanism 54 also is formed with a longitudinally extending slot, or channel, 110 (FIG. 2) adapted to receive, in a slidable manner, the top edge of the extension piece 79 (FIGS. 3 and 4). As shown in FIGS. 3 and 4, when the support mechanism 54 is positioned on the extension piece 79, the third shielding member 48 rests on top of the adjusting screws 106 so that adjustment of the screws 106 is effective to vary the tilt or angle of shielding member 48 relative to the top wall 60. Accordingly, when installing shielding member 48, the adjusting screws 106 can be adjusted as needed to support the third shielding member 48 substantially parallel to the top wall 60, as shown in FIG. 4.

The fourth shielding member 50 is configured to cover a portion of the rear wall 66 of the chamber extending between the first magnet 70 and the second magnet 74. The fourth shielding member 50 is formed with an aperture 94 that is positioned and sized to correspond with the outlet opening 96 in the rear wall 66. The fourth shielding member 48 has one or more holes 98 sized to receive respective bolts (not shown) for releasably securing the shielding member to the rear wall 66.

The fifth shielding member 52 is configured to cover a top portion of the barrier 78. The fifth shielding member 52, which is shaped to correspond to the curvature of the barrier 78, is formed with a slot, or channel, 68 in its bottom surface for receiving the top edge of the barrier 78 (FIG. 4).

Desirably, the components of the shielding assembly 40 (i.e., the first shielding member 44, the second shielding member 46, the third shielding member 48, the fourth shielding member 50, the fifth shielding member 52, and the support mechanism 54) are made of graphite or impregnated graphite because, as noted above, such materials do not seriously affect semiconductor performance.

The shielding assembly 40 can be used in the manner described above in connection with the embodiment of FIG. 1. For example, during a scheduled shut-down of the ion implanter, the components of the shielding assembly 40 are removed from the chamber 56, cleaned with a suitable cleaning agent, and then treated to remove the cleaning agent from the shielding assembly. If desired or needed, the inner surfaces of the chamber not covered by the shielding members during use also may cleaned using a suitable solvent to remove any process by-products that may have accumulated on these surfaces. After the shielding assembly 40 is cleaned and treated, the shielding assembly 40 is re-installed in the chamber 56 and the ion implanter is re-started for further processing of semiconductor wafers.

The shapes and sizes of the shielding members 44, 46, 48, 50, and 52 may be varied as needed to accommodate the shapes of different chambers or as otherwise desired. For example, in an alternative embodiment, the second shielding member 46 and the third shielding member 48 can be combined to form a single shielding member having a unitary construction for covering both the second magnet 74 and the portion of top wall 60 covered by shielding member 48. Advantageously, this embodiment may be easier and quicker to install and remove from the chamber.

In another embodiment, the width of the fourth shielding member 50 can be extended toward the side wall 62 so as to cover additional surface area of the rear wall 66.

In addition, additional shielding members can be provided for covering other surfaces inside the chamber 56. For example, an additional shielding member can be installed in a side-by-side relationship with the fourth shielding member 50 so as to cover the exposed area of the rear wall 66 between shielding member 50 and side wall 62 (FIGS. 3 and 4). In alternative embodiments, shielding members can be provided for covering one or both surfaces of the extension piece 79 or the bottom wall 58 between the side wall 62 and the first magnet 70.

Although shielding members 44, 46, 50, and 52 are shown positioned directly adjacent corresponding inner surfaces, it is also possible to space these shielding members from the inner surfaces (such as shielding member 48), provided the shielding members do not interfere with operation of the ion implantation apparatus.

Advantageously, the illustrated embodiments are designed to be retrofitted into existing ion implantation apparatus in current use.

Moreover, the embodiments of the present disclosure can be extended to semiconductor manufacturing devices other than ion implantation devices, such as sputtering apparatus and plasma etch apparatus. For instance, removable graphite or impregnated graphite shielding members can be used to cover the inner surfaces of such devices to shield the surfaces from impurities produced during operation of the devices and/or to prevent erosion of the surfaces.

The invention has been described with respect to particular embodiments and modes of action for illustrative purposes only. The present invention may be subject to many modifications and changes without departing from the spirit or essential characteristics thereof. We therefore claim as our invention all such modifications as come within the scope of the following claims.

We claim:

1. A method of reducing doping process impurities in an ion implantation apparatus having a chamber through which an ion beam path extends, the method comprising:
   providing a removable shielding assembly for the chamber comprising at least first and second removable shielding members, the at least first and second removable shielding members being made of graphite or impregnated graphite;
   installing the shielding assembly in the chamber such that the first shielding member covers a first magnetic area inside the chamber and the second shielding member covers a second magnetic area inside the chamber;
   using the ion implantation apparatus for implanting ions into semiconductor wafers;
   removing the shielding assembly from the chamber after the ion implantation apparatus has been used for implanting ions into semiconductor wafers for a period of time;
   cleaning the shielding assembly while the shielding assembly is removed from the chamber; and
   re-installing the shielding assembly in the chamber for further use of the ion implantation apparatus.

2. The method of claim 1, wherein the shielding assembly includes a third shielding member adapted to cover a side surface inside the chamber extending between the first and second magnetic areas.

3. The method of claim 1, wherein the shielding assembly includes a third shielding member adapted to extend from a side edge of the second shielding member in a side-by-side relationship so as to cover a portion of a top surface inside the chamber adjacent the second magnetic area.

4. The method of claim 3, wherein the act of installing the shielding assembly comprises mounting a support mechanism in the chamber for supporting the third shielding member in a position juxtaposed to the top surface, and installing the third shielding member in the chamber, with a side edge of the third shielding member overlapping and supported on an adjacent edge of the second shielding member and a bottom surface of the third shielding member resting on the support mechanism.

5. The method of claim 4, wherein the act of installing the third shielding member further includes adjusting an adjustment mechanism of the support mechanism so that the third shielding member is supported substantially parallel to the top surface.

6. The method of claim 1, wherein the act of cleaning the shielding assembly further includes treating the shielding assembly such that the shielding assembly is substantially free of a cleaning agent used to clean the shielding assembly.

7. The method of claim 1, wherein the act of treating the shielding assembly comprises heating the shielding assembly to remove the cleaning agent.

8. A method of maintaining an ion implantation apparatus having a chamber through which an ion beam path extends, the method comprising:
providing a removable shielding assembly for the chamber comprising a first shielding member for covering a first magnetic area in the chamber, a second shielding member for covering a second magnetic area in the chamber, a third shielding member for covering a side surface area in the chamber extending between top and bottom surfaces of the chamber, and a fourth shielding member for covering a top surface area in a side-by-side relationship with the second shielding member, wherein the first, second, third, and fourth shielding members are made of graphite or impregnated graphite; and
installing the shielding assembly in the chamber such that the first shielding member covers the first magnetic area, the second shielding member covers the second magnetic area, the third shielding member covers the side surface area, and the fourth shielding member covers the top surface area.

9. The method of claim 8, further comprising:
using the ion implantation apparatus for implanting ions into semiconductor wafers;
removing the shielding assembly from the chamber after the ion implantation apparatus has been used for a period of time;
cleaning the shielding assembly while the shielding assembly is removed from the chamber; and
re-installing the shielding assembly in the chamber for further use of the ion implantation apparatus.

10. The method of claim 8, wherein the first, second, third, and fourth shielding members are made entirely of graphite or impregnated graphite.

11. The method of claim 8, further comprising installing an adjustable support mechanism in the chamber, the support mechanism being configured to support the fourth shielding member and vary the tilt of the fourth shielding member relative to the top surface area.

12. The method of claim 11, further comprising adjusting the support mechanism so that the fourth shielding member is supported substantially parallel to the top surface area.

13. An ion implanting apparatus comprising:
a chamber through which an ion beam path extends, the chamber having a bottom surface and a top surface, the bottom surface having a bottom magnetic area and a top surface having a top magnetic area;
a first shielding member comprising a unitary body having a raised central portion for completely covering the bottom magnetic area and an outer portion substantially surrounding the central portion; and
a second shielding member comprising a unitary body having a raised central portion for completely covering the top magnetic area and an outer portion substantially surrounding the central portion;
wherein the first and second shielding members are configured to be easily removable from the chamber to facilitate cleaning of the shielding members, the first and second shielding members being made entirely of graphite or impregnated graphite.

14. The apparatus of claim 13, wherein the first and second shielding members are substantially identical in size and shape.

15. The apparatus of claim 13, further comprising a third shielding member configured to cover a side surface inside the chamber extending between the top and bottom surfaces, the third shielding member being configured to be removable from the chamber and being made entirely of graphite or impregnated graphite.

16. The apparatus of claim 13, further comprising a third shielding member configured to cover a portion of the top surface in a side-by-side relationship with the second shielding member, the third shielding member being configured to be removable from the chamber and being made only of graphite or impregnated graphite.

17. The apparatus of claim 16, further comprising a support mechanism adapted for mounting in the chamber in a position such that the support mechanism supports the third shielding member in opposing relationship to the top surface of the chamber.

18. The apparatus of claim 17, wherein the support mechanism is configured to vary the tilt of the third shielding member relative to the top surface.

19. The apparatus of claim 18, wherein the support mechanism comprises a body and at least one adjusting bolt threadably received in the body, the bolt having an upper end positioned to support the third shielding member, the bolt being adjustable to vary the tilt of the third shielding member relative to the top surface.

20. The apparatus of claim 13, further comprising an arcuate-shaped shielding member configured to cover a top portion of a barrier extending upwardly from the bottom surface of the chamber.

21. An ion implanting apparatus comprising:
a chamber through which an ion beam path extends having a bottom surface and a top surface;
a bottom magnet disposed on the bottom surface, the bottom magnet having a magnet core;
a top magnet disposed on the top surface, the top magnet having a magnet core;
a first shielding member comprising a unitary body having a raised central portion for covering the magnet core of the bottom magnet and an outer portion substantially surrounding the central portion for covering a surface of the bottom magnet surrounding its respective magnet core; and a second shielding member comprising a unitary body having a raised central portion for covering the magnet core of the top magnet and an outer portion substantially surrounding the central portion for covering a surface portion of the top magnet surrounding its respective magnet core;

a third shielding member configured to cover a side surface area inside the chamber extending between the top and bottom surfaces;

a fourth shielding member configured to cover a portion of the top surface in a side-by-side relationship with the second shielding member;

a support mechanism adapted to be mounted in the chamber for supporting the fourth shielding member in the chamber such that the fourth shielding member is juxtaposed the top surface of the chamber, the support mechanism being configured to vary the tilt of the fourth shielding member relative to the top surface;

an arcuate-shaped, upright barrier coupled to the bottom surface of the chamber; and a fifth shielding member configured to cover a top portion of the barrier;

wherein the first, second, third, fourth and fifth shielding members are configured to be removable from the chamber for cleaning the shielding members outside of the chamber, the first, second, third, fourth and fifth shielding members being made of isotropic graphite.

22. The apparatus of claim 15, wherein the third shielding member comprises first and second edges, the first edge of the third shielding member contacting an adjacent edge of the first shielding member and the second edge of the third shielding member contacting an adjacent edge of the second shielding member.

23. The apparatus of claim 16, wherein the third shielding member has a lip portion that engages an adjacent lip portion of the second shielding member such that the third shielding member is at least partially supported by the second shielding member.

24. The apparatus of claim 23, wherein the lip portions of the second shielding member and the third shielding member define areas of reduced thickness of the second and third shielding members, the areas of reduced thickness being dimensioned such that the third shielding member is coplanar with the second shielding member when the shielding members are installed in the chamber.

25. The apparatus of claim 19, wherein the body of the support mechanism is formed with a slot that is dimensioned to fit over a top edge of an existing plate in the chamber so as to support the support mechanism.

26. The apparatus of claim 15 wherein the third shielding member is formed with an aperture that is sized and positioned to correspond with an ion-beam outlet in the side surface of the chamber.

27. The method of claim 1, wherein the shielding members are made of isotropic graphite.

28. The method of claim 8, wherein the shielding members are made of isotropic graphite.

29. The apparatus of claim 13, wherein the shielding members are made of isotropic graphite.

* * * * *